(12) United States Patent
Lin

(10) Patent No.: US 6,312,856 B1
(45) Date of Patent: Nov. 6, 2001

(54) HALF-TONE PHASE SHIFT MASK FOR FABRICATION OF POLY LINE

(75) Inventor: Chin-Lung Lin, Kaohsiung (TW)

(73) Assignee: United Microelectronics Corp., Hsinchu (TW)

(*) Notice: Subject to any disclaimer, the term of this patent is extended or adjusted under 35 U.S.C. 154(b) by 0 days.

(21) Appl. No.: 09/455,720

(22) Filed: Dec. 7, 1999

(51) Int. Cl.⁷ .................................................. G03F 9/00
(52) U.S. Cl. ............................................................ 430/5
(58) Field of Search .......................... 430/5, 322; 716/19, 716/20, 21

(56) References Cited

U.S. PATENT DOCUMENTS 6,114,071 * 9/2000 Chen et al. ............................. 430/5

* cited by examiner

Primary Examiner—S. Rosasco

(74) Attorney, Agent, or Firm—Thomas, Kayden, Horstemeyer & Risley

(57) ABSTRACT

A half-tone phase shift mask is formed from the composite structure of a mask substrate and a half-tone phase shifting layer. The half-tone phase shifting layer induces a 180° phase shift to light passing through the mask. The half tone phase shifting layer further includes a main pattern having a first width and a first length, and an assist feature having a second width and a second length. The assist feature is parallel to the main pattern and disposed at both sides of the main pattern while being separated therefrom by a distance. Using deep ultraviolet light as the exposure source, a wafer scale of the first width is about 0.1–0.15 μm, a wafer scale of the second width is about 0.055–0.09 μm and the distance between the main pattern and the assist feature is about 0.22–0.27 μm.

17 Claims, 2 Drawing Sheets

HALF-TONE PHASE SHIFT MASK FOR FABRICATION OF POLY LINE

BACKGROUND OF THE INVENTION

1. Field of Invention

The present invention relates to phase shift mask (PSM). More particularly, the present invention relates to half-tone phase shift mask.

2. Description of Related Art

Currently, photolithography plays an essential role in semiconductor fabrication. For example, processes for patterning a structure or doping a region in a wafer always require several photolithography processes. In a photolithography process, exposure resolution and depth of focus (DOF) are two important parameters that determine photolithography quality.

A binary mask, which is made of quartz having chrome pattern coated thereon and is used for design rule above 0.18 μm in semiconductor fabrication, can obtain a pattern with high quality on the photoresist layer. However, when the semiconductor structure is required to be under 0.18 μm in size, diffraction of light causes serious problems due to the reduced size of the hole and line on the mask. In the photolithography process, especially, for forming a poly gate in the logic circuitry region of dynamic random access memory (DRAM), a desired pattern such as sole poly line is hard to obtain on the wafer because of the diffraction of light. As a result, the incorrect pattern causes a failure of a subsequent etching process of poly line and yield of the product is thus reduced.

SUMMARY OF THE INVENTION

The invention provides a half-tone phase shift mask applicable to the photolithography process of a poly gate with a size under 0.18 μm.

As embodied and broadly described herein, the invention provides a half-tone phase shift mask which includes a mask substrate and a half-tone phase shifting layer formed thereon, wherein light passing through the half-tone phase shifting layer portion of the mask has a 180° phase shift. The half tone phase shifting layer further includes a main pattern having a first width and a first length, and an assist feature having a second width and a second length, in which the assist feature is parallel to the main pattern and disposed at a distance on both sides of the main pattern. Using deep ultraviolet light (DUB) as exposing source, a wafer scale of the first width is about 0.1–0.15 μm, a wafer scale of the second width is about 0.055–0.09 μm and the distance between the main pattern and the assist feature is about 0.22–μm.

This invention further provides a method of fabricating a poly line formed on a logic circuitry region of DRAM. A polysilicon layer is formed on a semiconductor substrate and a photoresist layer is formed on the polysilicon layer. A half-tone PSM is employed to pattern the photoresist layer and then the patterned photoresist layer patterns the polysilicon layer to form a poly line. The half-tone PSM has a mask substrate and a half-tone phase shifting layer formed thereon. The half-tone phase shifting layer includes a main pattern and an assist feature. The main pattern and the assist feature are used to form a poly line pattern on a wafer when the light penetrates through the half-tone PSM.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

A conventional half-tone phase shift mask is generally applicable in a photolithography process for forming contact window or a dense pattern of DRAM. The invention utilizes a half-tone phase shift mask to fabricate a desired pattern of logic circuitry region in a DRAM. The pattern of the mask has a main pattern and also includes an assist feature, which enhances resolution of a light source so as to obtain a required poly line pattern after exposure.

Figure 1:
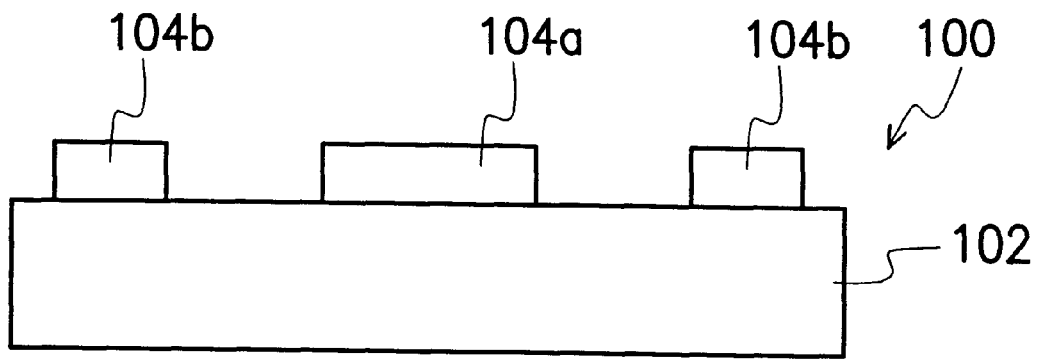
FIG. 1 is a schematic, cross-sectional view of a half-tone phase shift mask according to one preferred embodiment of this invention.
Figure 2:
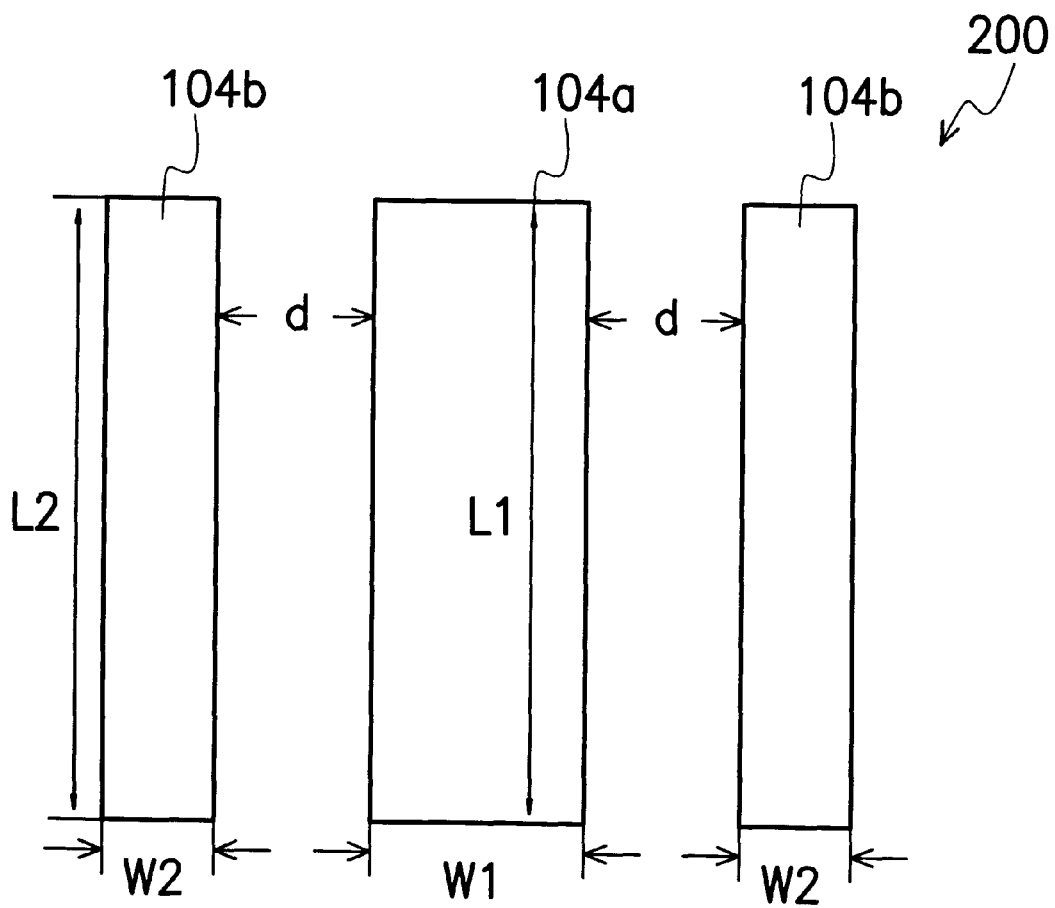
FIG. 2 is schematic, top view of a half-tone phase shift mask according to one preferred embodiment of this invention.

FIG. 1 illustrates a cross-sectional view of a half-tone PSM according to one preferred embodiment of the invention, and FIG. 2 illustrates a top view of a half-tone PSM according to one preferred embodiment of the invention. Referring to FIG. 1 and FIG. 2, a half-tone phase shift mask 100 according to the preferred embodiment of the invention has a half-tone phase shifting layer 104a, 104b, which is partially transparent, formed on a substrate mask 102. The phase shifting layer 104a, 104b induces a 180° phase shift in light passing through the half-tone phase shift mask; that is, the optical difference is 180°, in which the transmittance of the half-tone phase shifting layer is preferably less than 10%. The substrate mask 102 is made of transparent material such as quartz, and the half-tone phase shifting layer can be $MoSi_zO_xN_y$, for example. The transmittance of $MoSi_zO_xN_y$ is about 6%.

Referring to FIG. 2, since the desired width of the poly line in the logic circuitry region is reduced, a conventional binary mask cannot satisfy the requirements of the reduced size. Therefore, this invention utilizes a half-tone phase shift mask 100 to form a poly line when the width of the poly line is in the range of about 0.15–0.1 μm. However, the smaller the width of the hole and line of the mask are, the more easily diffraction occurs. Thus, a poly line pattern 200 on the half-tone phase shift mask 104 cannot only have a main pattern 104a, but must also have an assist feature 104b in order to form the poly line on the wafer. The assist feature 104b having a width 'W2' and a length 'L2' is parallel to the main pattern 104a having a width 'W1' and a length 'L1'. The assist feature 104b is separated from the main pattern 104a by a distance 'd', such that the assist feature 104b helps to form a desired poly line pattern when light passes through the half-tone phase shift mask 100.

When deep ultra violet light (deep UV) is used as an exposure light source and the width 'w1'of the wafer scale of the main pattern 104a is about 1.0–0.15 μm, the width 'w2' of the assist feature 104b is about 0.055–0.09 μm, and the distance 'd' between the main pattern 104a and the assist feature 104b is about 0.22–0.27 μm. The scale of the pattern on the mask is decided by a magnifying power of an exposure apparatus, and accordingly, in current semiconductor processing, the size of the pattern on the mask is a 4-times magnification of the wafer scale. That is, when the deep UV is employed as an exposure source, 4 times the wafer scale is the dimension of the mask that needs to be fabricated. In addition, using the design of the assist feature 104b to perform a photolithography process enables the resolution to be increased to about 0.03 μm. For meeting the requirement of a depth of focus (DOF) of 0.61 μm, the process window of the exposure energy using the half-tone phase shift mask is increased by 10%.

Figure 3A:
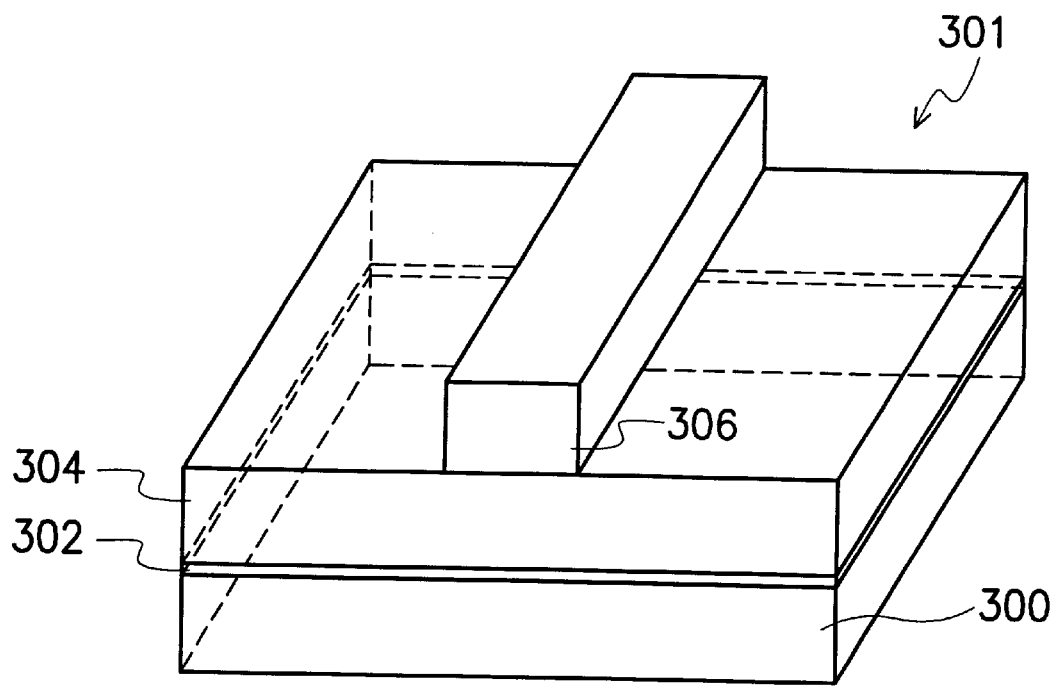
FIG. 3A–3B are schematic, cross-sectional views illustrating fabrication of a poly line using a half-tone phase shift mask.
Figure 3B:
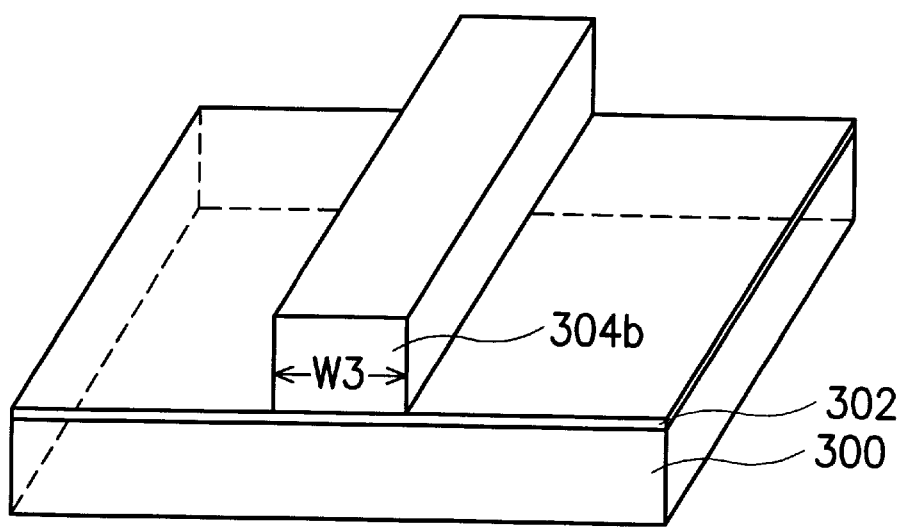

FIG. 3A and FIG. 3B illustrate fabrication of a poly line using a half-tone phase shift mask according to the preferred embodiment of the invention. A gate oxide layer 302 is formed by thermal oxidation, for example, on a semiconductor substrate 300. A polysilicon layer 304 is formed by chemical vapor deposition (CVD) on the gate oxide layer 302. A photoresist layer is coated on the polysilicon layer 304 in the logic circuitry region 301. Then, the half-tone phase shift mask 100 (FIG. 1) is utilized to perform exposure on and develop the photoresist layer, such that a patterned photoresist layer 306 as shown in FIG. 3A is formed. Using the patterned photoresist layer 306 as a mask, the polysilicon layer 304 is etched by, for example, dry etching, and a poly line as shown in FIG. 3B is formed. The patterned photoresist layer 306 is removed. Since the photolithography process for poly line 304b in the logic circuitry region 301 is performed with the half-tone phase shift mask 100 as shown in FIG. 1, the width 'w3' of poly line 304a can be controlled to be a range of about 0.1–0.15 μm when deep UV serves as an exposure source.

This invention utilizes a half-tone phase shift mask to perform photolithography; thus, the poly line width of the logic circuitry region is reduced and the critical dimension (CD) lowers to under 0.15 μm. The assist feature on the mask pattern not only increases the margin of the exposure margin, but also prevents diffraction so as to obtain a correct pattern on the wafer.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A half-tone phase shift mask for use in fabrication of a DRAM logic circuitry region, comprising:
   a mask substrate; and
   a half-tone phase shifting layer, formed on the mask substrate, the half-tone phase shifting layer comprising:
      a main pattern having a first width and a first length; and
      an assist feature having a second width and a second length, disposed at both sides of the main pattern parallel to the main pattern, and separated therefrom by a distance.

2. The mask according to claim 1, wherein the mask substrate is made of quartz.

3. The mask according to claim 1, wherein the half-tone phase shift mask is made of $MoSi_zO_xN_y$.

4. The mask according to claim 1, wherein a transmittance is less than about 10%.

5. The mask according to claim 1, wherein a wafer scale of the first width is in a range of about 0.1–0.15 μm when deep ultraviolet light is used as an exposure source.

6. The mask according to claim 5, wherein a wafer scale of the second width is in a range of about 0.055–0.090 μm.

7. The mask according to claim 5, wherein a wafer scale of the distance is in a range of about 0.022–0.027 μm.

8. The mask according to claim 1, wherein the half-tone phase shifting layer induces a 180° phase shift.

9. The mask according to claim 1, adapted to a method of fabricating a poly line in a semiconductor process, the method comprising:
   providing a semiconductor conductor having a polysilicon layer formed thereon; and
   using the half-tone phase shift mask to pattern the polysilicon layer to form a poly line on the semiconductor substrate.

10. A phase shift mask, comprising:
    a mask substrate; and
    a phase shifting layer, formed on the mask substrate, wherein the phase shifting layer induces a 180° phase shift to light passing through the phase shift mask, the phase shifting layer comprising
       a main pattern having a first width and a first length; and
       an assist feature having a second width and a second length, wherein the assist feature is parallel to the main pattern and separated therefrom by a distance:
    wherein the main pattern and the assist feature form a poly line pattern on a wafer when light passes through the phase shift mask.

11. The mask according to claim 10, wherein the mask substrate is made of quartz.

12. The mask according to claim 11, wherein the half-tone phase shift mask is made of $MoSi_zO_xN_y$.

13. The mask according to claim 10, wherein the phase shifting layer is partially transparent.

14. The mask according to claim 10, wherein a transmittance is lower than about 10%.

15. The mask according to claim 10, wherein a wafer scale of the first width is in a range of about 0.1–0.15 μm when a deep ultraviolet light is used as an exposure source.

16. The mask according to claim 16, wherein a wafer scale of the second width is in a range of about 0.055–0.090 μm.

17. The mask according to claim 16, wherein a wafer scale of the distance is in a range of about 0.22–0.27 μm.

* * * * *